US006272018B1

United States Patent
Feld et al.

(10) Patent No.: US 6,272,018 B1
(45) Date of Patent: Aug. 7, 2001

(54) METHOD FOR THE VERIFICATION OF THE POLARITY AND PRESENCE OF COMPONENTS ON A PRINTED CIRCUIT BOARD

(75) Inventors: Michael Feld; David Tordjman; Alex Feld, all of Côte St-Luc (CA)

(73) Assignee: Original Solutions Inc. (CA)

(*) Notice: Subject to any disclaimer, the term of this patent is extended or adjusted under 35 U.S.C. 154(b) by 0 days.

(21) Appl. No.: 09/247,811

(22) Filed: Feb. 11, 1999

(51) Int. Cl.[7] ..................................................... H05K 7/02
(52) U.S. Cl. ....................... 361/760; 174/250; 174/256; 174/260; 257/797; 29/833; 29/834
(58) Field of Search ............................. 361/748, 760, 361/773, 777, 782, 783, 807, 808, 811, 820, 821; 174/250, 253, 256, 261, 262, 260; 257/797; 438/14, 15, 16; 29/833, 834, 836; 356/237.4, 237.5; 250/372, 461.1; 382/145, 147; 348/87, 126; 434/224, 379; 446/91

(56) References Cited

U.S. PATENT DOCUMENTS

| | | | |
|---|---|---|---|
| 3,043,022 | * 7/1962 | Crews et al. ........................ | 434/224 |
| 3,588,347 | 6/1971 | Montone et al. . | |
| 3,988,535 | * 10/1976 | Hickman et al. .................... | 348/87 |
| 4,259,661 | 3/1981 | Todd .................................. | 382/205 |
| 4,442,542 | 4/1984 | Lin et al. . | |
| 4,514,436 | 4/1985 | Moerschel . | |
| 4,549,206 | 10/1985 | Suzuki et al. . | |
| 4,565,314 | * 1/1986 | Scholz ................................ | 29/834 |
| 4,570,180 | 2/1986 | Baier et al. ........................ | 382/145 |
| 4,692,690 | 9/1987 | Hara et al. . | |
| 4,778,745 | 10/1988 | Leung . | |
| 4,973,852 | 11/1990 | Denkevitz . | |
| 5,034,802 | * 7/1991 | Liebes, Jr. et al. ................ | 29/834 |
| 5,109,319 | * 4/1992 | Potash ................................ | 361/773 |
| 5,132,864 | * 7/1992 | Takemura et al. ................. | 361/777 |
| 5,204,910 | 4/1993 | Lebeau . | |
| 5,237,622 | 8/1993 | Howell . | |
| 5,260,154 | 11/1993 | Forrest . | |
| 5,311,598 | 5/1994 | Bose et al. . | |
| 5,446,623 | * 8/1995 | Kanetake ........................... | 361/773 |
| 5,457,880 | * 10/1995 | McKinley et al. ................. | 29/833 |
| 5,521,427 | * 5/1996 | Chia et al. ......................... | 257/797 |

(List continued on next page.)

OTHER PUBLICATIONS

"Algorithm to detect solder bridge on printed circuit board", IBM Technical Disclosure Bulletin, US IBM Corp. New York, vol. 33, No. 10A, Mar. 1, 1991, pp. 417–418, XP000110106, ISSN: 0018–8689.

Primary Examiner—Jayprakash N. Gandhi
Assistant Examiner—John B. Vigushin
(74) Attorney, Agent, or Firm—Parkhurst & Wendel, LLP

(57) ABSTRACT

The invention relates to a method for the verification of the presence and proper orientation of a component on a printed circuit board. The board has a plurality of areas for receiving a component respectively. Each area is marked in the center thereof with a first marker. Adjacent each area, and indicative of the polarity of the component, a second marker is marked on the board. The presence or absence of a component can be evaluated by inspecting the board after it has been populated and determining whether any of the first markers appear, indicating that a component is missing. Verification of the polarity of a component is done by placing a marker on a portion of a component required to be installed in a predetermined position indicative of polarity. Inspection of the board once it has been populated will determine if the component is in the proper orientation by verifying if the second marker and the marker on the component are in alignment. Preferably, the first marker and the second marker are of different colors, and are preferably UV reflecting coatings.

7 Claims, 3 Drawing Sheets

U.S. PATENT DOCUMENTS

| | | | |
|---|---|---|---|
| 5,550,583 | * 8/1996 | Amir et al. | 348/126 |
| 5,586,058 | 12/1996 | Aloni et al. . | |
| 5,619,429 | 4/1997 | Aloni et al. . | |
| 5,637,919 | * 6/1997 | Grabbe | 257/797 |
| 5,644,102 | 7/1997 | Rostoker | 174/52.1 |
| 5,649,022 | 7/1997 | Maeda et al. . | |
| 5,677,702 | * 10/1997 | Inoue et al. | 345/32 |
| 5,774,572 | 6/1998 | Caspi . | |
| 5,774,573 | 6/1998 | Caspi et al. . | |
| 5,774,575 | 6/1998 | Tanaka et al. . | |
| 5,783,342 | 7/1998 | Yamashita et al. . | |
| 5,795,688 | 8/1998 | Burdorf et al. . | |
| 5,822,054 | 10/1998 | Coulthard | 356/237.2 |
| 5,864,394 | 1/1999 | Jordan, III | 356/237.2 |
| 5,870,449 | 2/1999 | Lee et al. | 378/57 |
| 5,875,004 | 2/1999 | Yamane et al. | 348/705 |
| 5,892,579 | 4/1999 | Elyasaf et al. | 356/239.8 |
| 5,892,841 | 4/1999 | Jochems et al. | 382/152 |
| 5,943,217 | * 8/1999 | Hashimoto | 361/777 |
| 5,943,437 | 8/1999 | Sumie et al. . | |
| 5,946,409 | * 8/1999 | Hori | 382/145 |
| 5,949,900 | 9/1999 | Nakamura et al. . | |
| 5,977,488 | * 11/1999 | Jeon | 174/250 |
| 5,999,640 | 12/1999 | Hatase et al. . | |
| 6,008,840 | 12/1999 | Jin et al. . | |
| 6,042,995 | 3/2000 | White . | |
| 6,051,348 | 4/2000 | Marinaro et al. . | |

* cited by examiner

METHOD FOR THE VERIFICATION OF THE POLARITY AND PRESENCE OF COMPONENTS ON A PRINTED CIRCUIT BOARD

FIELD OF THE INVENTION

The present invention relates to the verification of the polarity and presence of components installed on a printed circuit board.

DESCRIPTION OF THE PRIOR ART

Printed circuit boards are increasingly populated with greater numbers of components. A typical printed circuit board can house tens, if not hundreds of components, some of which require installation in a predetermined position, i.e. polarity.

Along with the increase in numbers of components on a printed circuit board, the task of inspecting each board for the presence of a component, and the proper orientation of given components has also become more complex. The inspection task is usually done by visually inspecting a board, either after the board has been populated, or if the board has been returned for a malfunction. Inspectors quickly become fatigued and stressed when performing this task, particularly when dealing with densely populated printed circuit boards. The inspection task is also labour-intensive.

There is thus a need for a simpler and more economical process for inspecting printed circuit boards for the presence and correct orientation or polarity of components.

SUMMARY OF THE INVENTION

It is an object of the invention to provide a simpler and more economical method for the verification of the presence of a component on a printed circuit board. In accordance with the invention, this object is achieved with a method for the verification of the presence of a component on a printed circuit board, comprising the steps of:
  a) providing a printed circuit board having a plurality of areas, each area being adapted to receive a component;
  b) marking at least a portion of each of said areas with a marker;
  c) installing each of said components in their respective areas; and
  d) inspecting said printed circuit board for the presence of a marker, the presence of a marker indicating that a component is missing.

It is also an object of the invention to provide a simpler and more economical method for the verification of the orientation of a component on a printed circuit board. In accordance with the invention, this object is achieved with a method for the verification of the orientation of a component on a printed circuit board, comprising the steps of:
  a) providing a printed circuit board having a plurality of areas, each area being adapted to receive a component, at least one of said components requiring installation in a predetermined position indicative of the polarity of the component;
  b) marking said printed board with at least one marker adjacent an area for receiving a component in said predetermined position;
  c) marking a portion of at least one component to be installed in said predetermined position, said marking being indicative of the polarity of said component;
  d) installing said components on said printed circuit board;
  e) inspecting said printed circuit board for markers on said printed circuit board and on said components, said component requiring installation in a predetermined position being installed in said predetermined position when said marker on said printed circuit board adjacent said area and said marker on said portion of said component are in alignment.

The invention is also concerned with a printed circuit board marked according to the above methods.

BRIEF DESCRIPTION OF THE DRAWINGS

The present invention and its advantages will be more easily understood after reading the following non-restrictive description of preferred embodiments thereof, made with reference to the following drawings, in which.

DESCRIPTION OF A PREFERRED EMBODIMENT OF THE INVENTION

Figure 1:
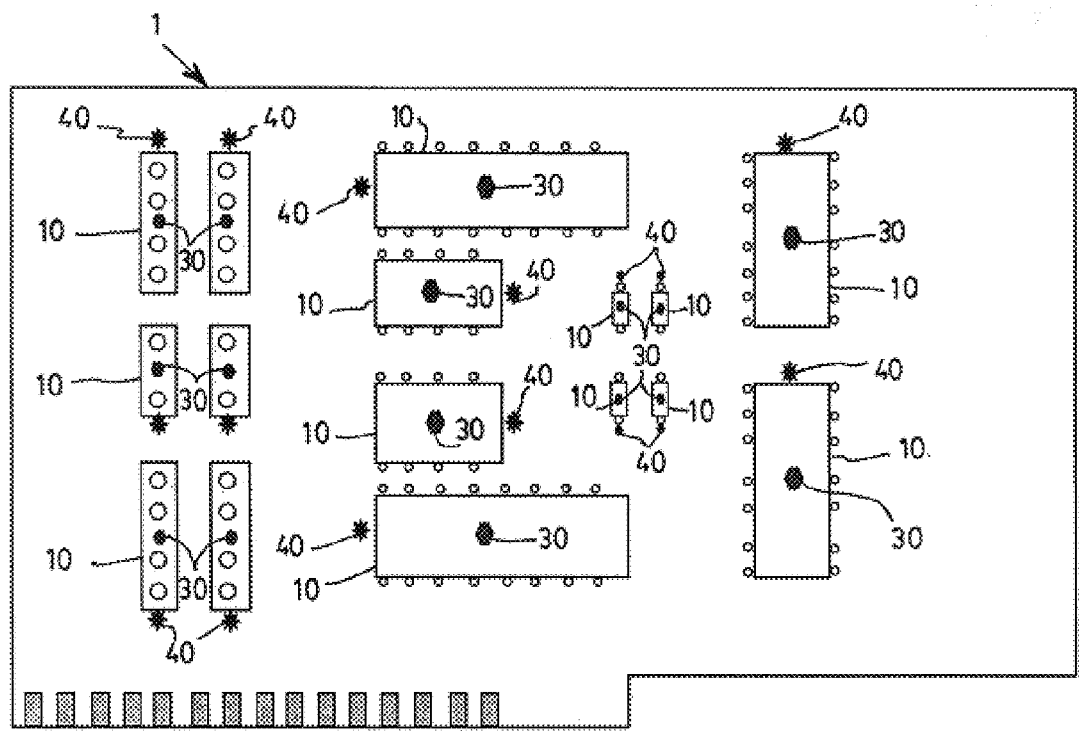
FIG. 1 is a schematic representation of an unpopulated printed circuit board marked according to a preferred embodiment of the invention.
Figure 2:
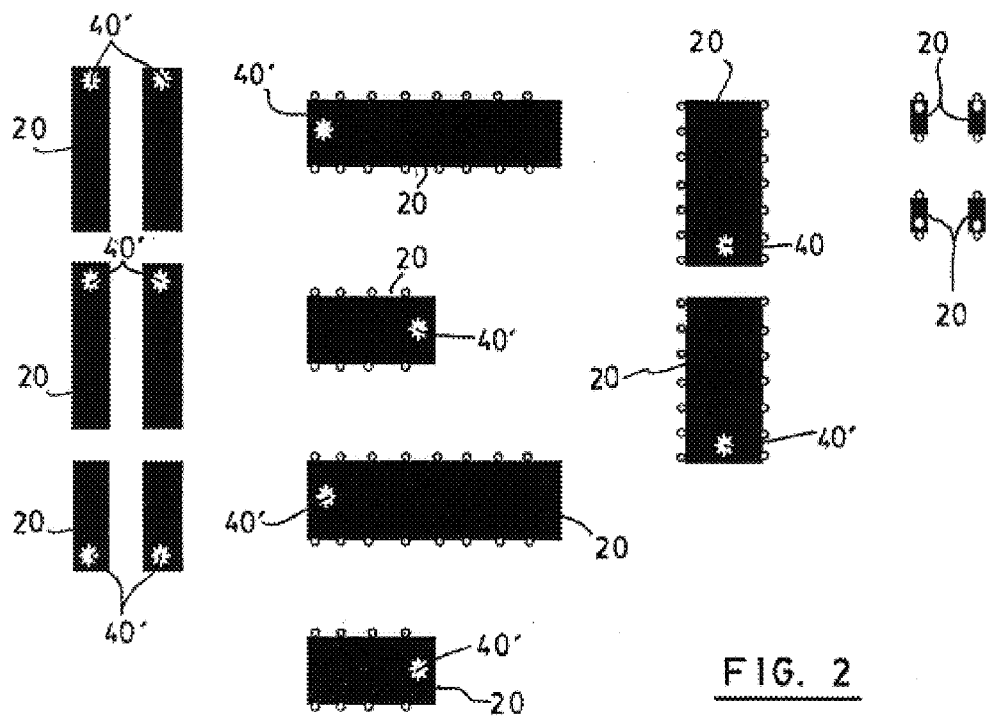
FIG. 2 is a schematic representation of the components for populating the printed circuit board of FIG. 1.

Referring now to FIG. 1, the invention is concerned with a method for the verification of the polarity and presence of components on a printed circuit board 1. The printed circuit board 1 is provided with a plurality of areas 10, each of which is designed to receive a component 20.

In order to determine if all of the components have been installed on the printed circuit board, also referred to as populating the board, each area 10 is provided with a marker 30, preferably in the center thereof. The marker 30 could be paint, etching, glue, or any other type of marking, but is preferably a UV reflecting conformal coating or glue which is invisible to the naked eye. Also preferably, the UV coating is cured into the printed circuit board 1, so that it will not fade over time.

Figure 3:
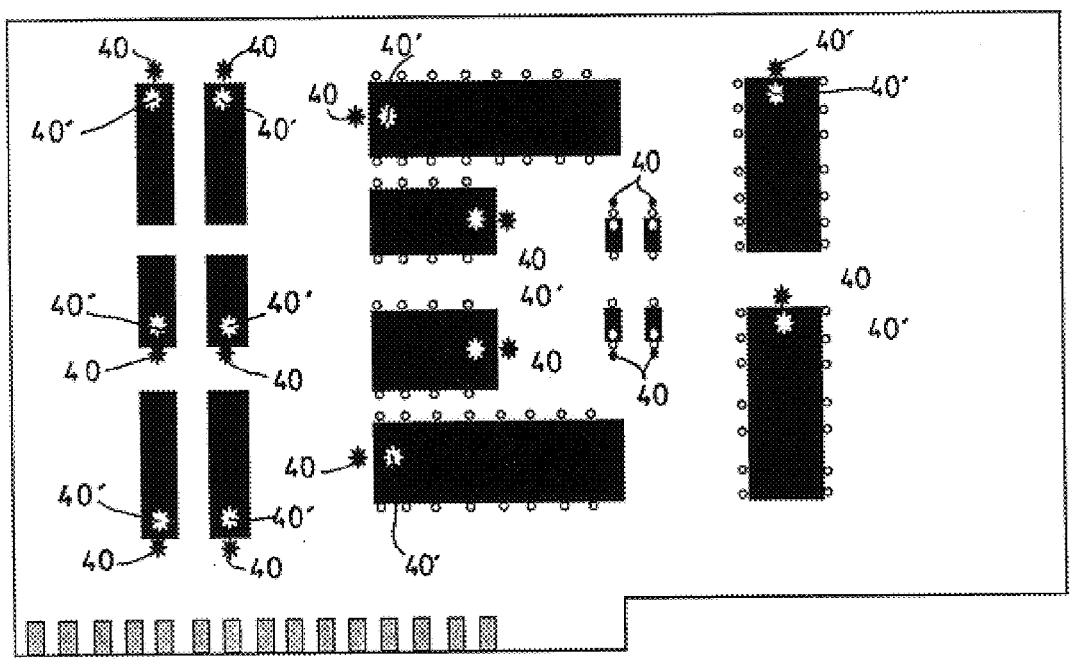
FIG. 3 is a schematic representation of a correctly populated printed circuit board.
Figure 5:
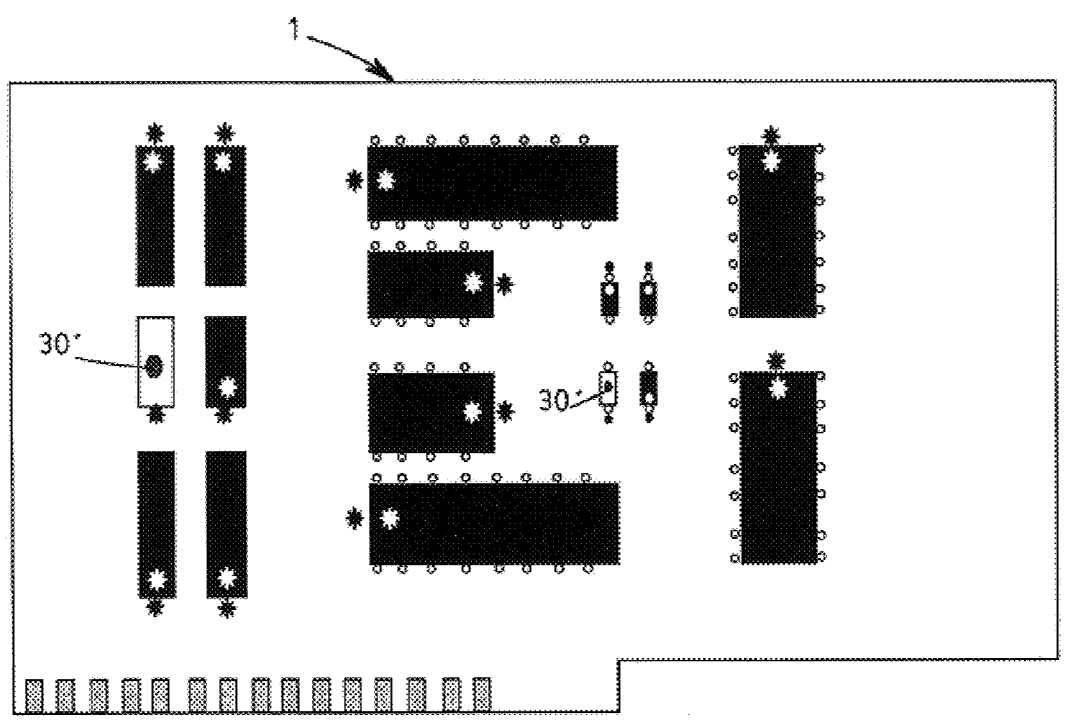
FIG. 5 is a schematic representation of an incorrectly populated printed circuit board, where some of the components are missing.

Once the printed circuit board 1 has been marked, the components are installed in their respective areas. Finally, the board 1 is visually inspected. If the board is marked with the UV reflecting coating, a UV light is shined on the board. If the board is completely populated in that there are no components missing, no markers 30 will appear during inspection, as can be seen in FIG. 3. However, if one or more components are missing, as shown in FIG. 5, the markers 30' will appear when the UV light is shone on the board. Consequently, a detailed visual inspection of a printed circuit board is no longer necessary, since it will be rapidly determined if a component is missing due to the presence, or absence of the markers 30.

It should be noted that the marking which is applied to the surface of a printed circuit board, when viewed under UV light or, alternatively, infrared radiation, radiates a signature. This also applies to a marking applied to a component.

The invention is also concerned with a method for verifying if a component has been placed in its proper orientation. Most components for populating a printed circuit board need to be placed in a predetermined position, indicative of the polarity of the component. If a component is not properly placed, the printed circuit board will not function properly, and the component will often have a reduced life span by virtue of this incorrect placement. Present components are provided with a notch which is indicative of the polarity of the component. However, when dealing with densely populated boards 1, it is often difficult to identify the notch. Furthermore, there is often no proper frame of reference on the board to verify if the component has been placed in the proper orientation.

Figure 4:
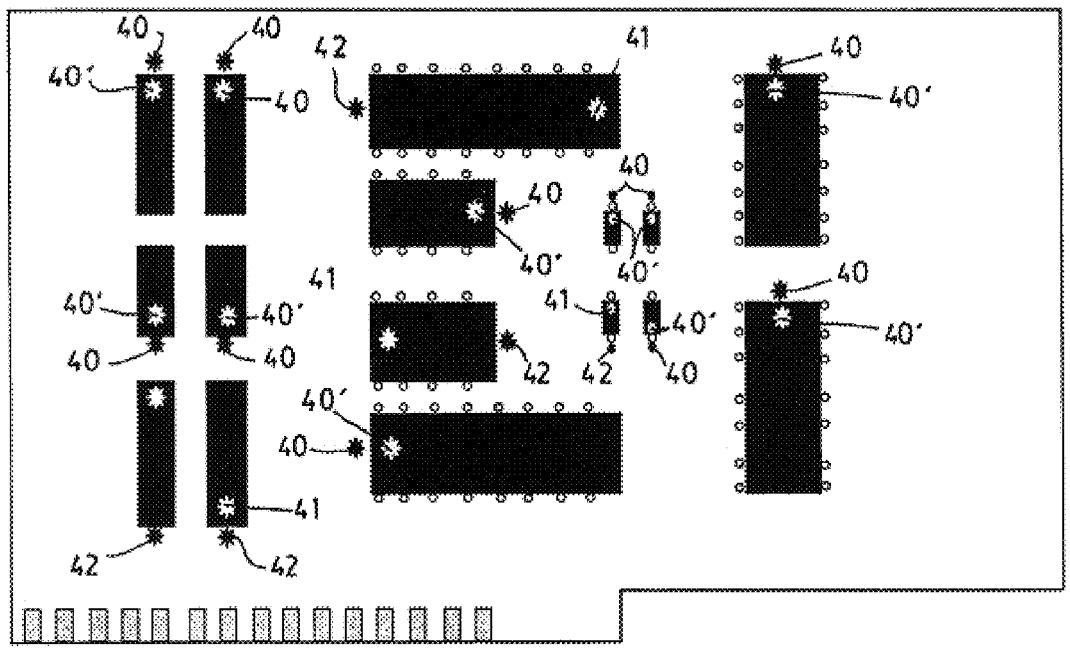
FIG. 4 is a schematic representation of an incorrectly populated printed circuit board, where all of the components are installed, but some are not installed in the correct orientation.

In accordance with the invention and as shown in FIGS. 1, 3 and 4, the board is further provided with another marker 40, located adjacent an area 10, but indicative of the position of the component to be placed therein. Each component 20 is also marked with a marker 40', indicative of the polarity of the component 20. Preferably, markers 40 and 40' are of the same color, but of a different color from marker 30 used to indicate the presence or absence of a component on a board 1. As with marker 30, markers 40 and 40' could be paint, etching or any other type of markings, but are preferably a UV reflecting coating. Also preferably, the UV coating is cured into the component 20 so that it will not fade over time.

The correct orientation of a component on a board is determined when markers 40 and 40' are in alignment, as illustrated in FIG. 3. However, in FIG. 4, markers 41 (on each component) and 42 (on the board 1) are not in alignment, indicating that the component is not in the proper orientation.

The invention thus simplifies the process required to fully inspect the orientation/alignment as well as the presence or absence of components on a printed circuit board. The invention also significantly improves the efficiency of quality control inspection by reducing fatigue and other emotional stresses suffered by inspectors. Finally, the invention reduces the number of inspectors required to perform inspection of printed circuit boards, and the quality of the printed circuit board is improved.

Although the present invention has been explained hereinabove by way of a preferred embodiment thereof, it should be pointed out that any modifications to this preferred embodiment within the scope of the appended claims is not deemed to alter or change the nature and scope of the present invention.

What is claimed is:

1. A printed circuit board having at least one area adapted to receive a component, at least one of the components requiring installation in a predetermined position indicative of the polarity of the component, the at least one area for receiving the at least one component requiring installation in said predetermined position bearing markings adjacent the area and indicative of the polarity of the component, and the at least one component requiring installation in said predetermined position bearing markings so that when said components are installed on said printed circuit board, correct polarity of each component requiring installation in said predetermined position can be determined by inspecting the printed circuit board to determine that the markings adjacent the area and a marker on the corresponding component are in alignment; wherein said markings adjacent said area and said marker on said component are a UV reflective coating.

2. A printed circuit board according to claim 1, wherein each of said areas of said printed circuit board bears another marking inside each of said areas.

3. A printed circuit board according to claim 2, wherein said marking adjacent said area is of a first color, and said other marking inside said area is of a second color.

4. A method for the verification of the presence of a component on a printed circuit board comprising the steps of:

providing a printed circuit board having a plurality of areas, each area being adapted to receive a component;

marking at least a portion of each of said areas with a marker, including an area for receiving a component in a predetermined position;

marking a portion of at least one component to be installed in said predetermined position;

installing each of said components in their respective areas; and inspecting said printed circuit board for the presence of markers on said printed circuit board and on said components, said component requiring installation in a predetermined position being installed in said predetermined position when said marker on said printed circuit board adjacent said area and said marker on said portion of said component are in alignment.

5. A method according to claim 4, wherein said method further includes the step of marking said portion of each of said areas with a first color, and marking said printed circuit board and said component requiring installation in said predetermined area with a second color.

6. A method according to claim 5, wherein said first color and said second color are UV reflecting coatings.

7. A method for the verification of the polarity of a component on a printed circuit board comprising:

providing a printed circuit board having a plurality of areas, each area being adapted to receive a component, at least one of said components requiring installation in a predetermined position indicative of the polarity of the component;

marking said printed board with at least one marker adjacent an area for receiving a component in said predetermined position;

marking a portion of at least one component to be installed in said predetermined position, said marking being indicative of the polarity of said component;

installing said components on said printed circuit board;

inspecting said printed circuit board for markers on said printed circuit board and on said components, said component requiring installation in a predetermined position when said marker on said printed circuit board adjacent said area and said marker on said portion of said component are in alignment; wherein said marker is a UV reflecting coating, and said step of inspecting said printed circuit board further includes the step of shining a UV light on said printed circuit board.

* * * * *